United States Patent [19]

Susko et al.

[11] 4,410,647

[45] Oct. 18, 1983

[54] EPOXY COMPOSITION AND SEALING OF INTEGRATED CIRCUIT MODULES THEREWITH

[75] Inventors: John R. Susko, Vestal; Robin A. Wheater, Owego, both of N.Y.

[73] Assignee: International Business Machines Corporation, Armonk, N.Y.

[21] Appl. No.: 210,917

[22] Filed: Nov. 28, 1980

[51] Int. Cl.$^3$ .......................... C08K 3/34; C08K 5/45
[52] U.S. Cl. ...................................... 524/88; 525/493
[58] Field of Search ................... 260/37 EP, 45.85 R, 260/45.85 T; 524/493, 88

[56] References Cited

U.S. PATENT DOCUMENTS 3,845,016 10/1974 Labana et al. ...................... 525/117
4,034,014 7/1977 Curtis, Jr. et al. ............. 260/37 EP
4,233,620 11/1980 Darrow et al. .................. 260/37 EP
4,292,230 9/1981 Kenney et al. .................. 260/37 EP

OTHER PUBLICATIONS

IBM Technical Disclosure Bulletin, vol. 22, No. 10, 3-80, p. 4467, "Curing Agent not Subject to Hydrolysis", Gleason et al.

*Primary Examiner*—J. Ziegler
*Attorney, Agent, or Firm*—Pollock, Vande Sande & Priddy

[57] ABSTRACT

A composition containing an epoxy polymer, 4,4'(2-acetoxy-1,3 glyceryl)bis anhydro trimellitate; a polyanhydride; and a solid filler; method of preparation, and the sealing of integrated circuit modules therewith are provided.

18 Claims, 1 Drawing Figure

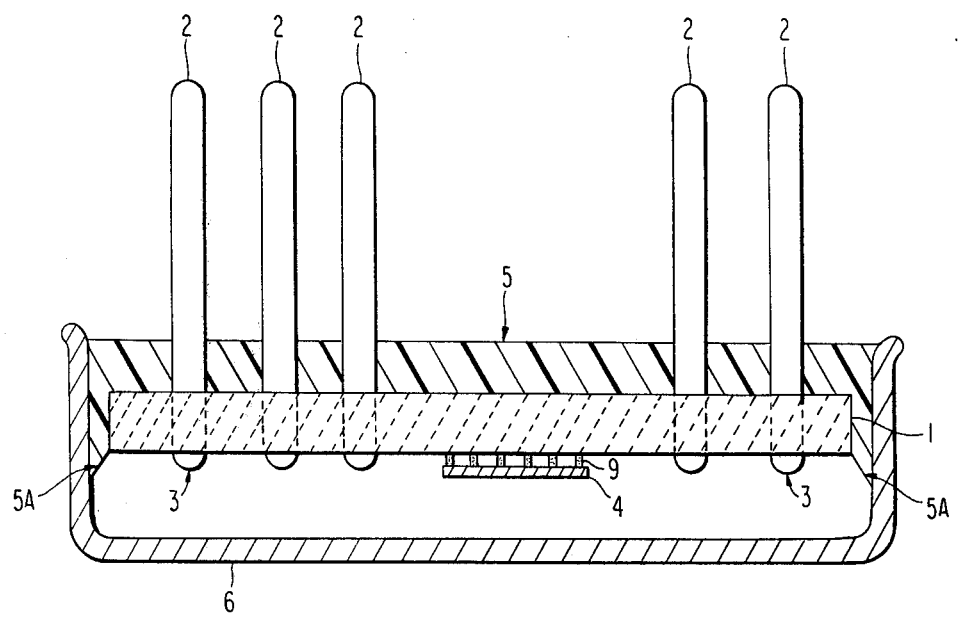

EPOXY COMPOSITION AND SEALING OF INTEGRATED CIRCUIT MODULES THEREWITH

TECHNICAL FIELD

The present invention is concerned with epoxy compositions which are especially suitable in the manufacture of integrated circuit modules. The epoxy compositions are especially suitable for hermetically sealing the backside of the substrate which contains the integrated circuit chip(s) to a cap. In addition, the present invention is concerned with the process for preparing the epoxy compositions as well as the process for hermetically sealing the backside of the substrate of an integrated circuit module by employing the particular epoxy compositions of the present invention.

The present invention is particularly concerned with those integrated circuit modules which contain a substrate having electrically conductive pins protruding therefrom and having attached to the backside of the substrate at least one integrated circuit chip, and including a cap or container into which the substrate is placed with the backside thereof being covered by the bottom inside of the cap or container.

BACKGROUND ART

During the preparation of integrated circuit modules, certain epoxy compositions have been employed to hermetically seal the backside of the substrate on which is attached at least one integrated circuit chip. Such compositions are employed to protect and seal the electrically active portions of the module.

In order for a composition to be commercially acceptable for sealing integrated circuit modules, it must possess a number of very critical properties. For instance, the composition must be a nonconductor of electricity and must be capable of withstanding degradation due to exposure to various chemicals, such as organic solvents and due to the effect of being exposed to the flow of electricity over extended periods of time. In addition, the composition must be resistant to reversion to nonfully cured products under adverse conditions of elevated temperature and high humidity over extended periods of time to be usable for integrated circuit packages to be employed in modern day computers.

The compositions must also possess significant strength characteristics so as to resist deterioration when subjected to mechanical stresses. The compositions should also have good flexibility and be able to withstand thermal cooling (i.e. expansion and contraction due to thermal changes) without cracking. The compositions also must be resistant to permeation and diffusion of gases and solvents. However, the composition must adhere tenaciously to the particular substrate employed.

In addition, the compositions must have very carefully controlled flow characteristics so that such will flow sufficiently down the sides of the substrate to hermetically seal such to the cap or container but must not flow so far downward into the cap or can as to contact or cover the backside of the substrate. The problem of flowing into the cap or can too much is referred to as "run-in". This occurs at space gaps at the corners between the substrate which generally has a slightly rounded edge and the cap or can which is generally square. If the compositions flows completely to the underside of the substrate, then problems in reliability could be caused by destruction of solder joints upon thermal expansion. This problem has been compensated for by closely fitting the can or cap to the substrate, such as by crimping the can or cap. In addition, in view of the crucial flow characteristics needed, compositions employed today for backsealing are applied in the liquid form usually from organic solvents.

DISCLOSURE OF THE INVENTION

The present invention is concerned with certain epoxy compositions which are particularly useful for sealing of integrated circuit modules. The compositions of the present invention are capable of being applied as a powder or can be precompressed into a solid preform of a predetermined shape. In addition, the compositions of the present invention can be formulated in liquid form by dissolution in organic solvent. The compositions of the present invention when applied as powder or solid preform can be heated to elevated temperature at which point the composition melts, flows, and then cures to a hard durable hermetic protective coating. The compositions possess the combination of flow characteristics and curing rate such that the compositions flow to provide the hermetic seal but cure to an extent that such do not flow downward into the cap or can to such an extent that "run-in" occurs.

The compositions of the present invention prior to curing provide for a relatively short-term, low temperature cure rate, such as about five hours at about 140° C. The materials employed in the compositions of the present invention are relatively safe to use. Furthermore, the compositions are of a very low melt range, thereby providing a broad range of viscosity flow properties which are achievable according to the particular use of the composition. Furthermore, the compositions are relatively nonreactive at room temperature and are capable of being prepared without any reactive volatile materials. In addition, the compositions of the present invention are readily compressible into solid preforms.

Moreover, the compositions of the present invention after curing provide for very long-term hydrolytic stability, have high glass transition temperatures, and high tensile and high cohesive strengths. In addition, the compositions of the present invention after curing demonstrate good flexibility without sacrificing strength characteristics over a relatively wide temperature range, such as from about 25° to about 100° C. The compositions of the present invention also provide excellent mechanical adhesion to the ceramic substrate, such as greater than about 20 lbs/in. and good adhesion to the aluminum cap, such as about 12–14 lbs/in. Moreover, the compositions of the present invention after cure provide for long-term high temperature stability. For instance, 0% cracks are observed when the cured modules are subjected to elevated temperatures, such as about 150° C. for at least 400 hours.

The above beneficial and important characteristics are achieved by employing a composition containing:

A. about 50 to about 65% by weight of an epoxy polymer;
B. about 2 to about 15% by weight of 4,4'-(2-acetoxy-1,3 gyceryl)-bis anhydro trimellitate;
C. about 2 to about 15% by weight of a polyanhydride in addition to B; and
D. about 10 to about 45% by weight of a solid filler.

The epoxy polymer employed should have an epoxy equivalent weight of at least about 400. In addition, the polyanhydride should be solid at normal room temperatures. The fillers employed generally have a particle size of about 5 to about 50 microns.

The present invention is also concerned with the method for preparing the above composition which includes the following steps:

A. admixing the epoxy and solid filler at temperatures of about 140° to about 160° C. until a uniform melt is obtained;
B. cooling the melt to about 65° to 75° C.;
C. admixing the trimellitate and polyanhydride into the melt while maintaining the temperature at about 65° to about 75° C.; and
D. cooling the composition.

The present invention is also concerned with an integrated circuit module containing a substrate having electrically-conductive pins protruding therefrom, and having attached to the backside thereof at least one integrated circuit chip wherein the hermetical seal of the backside of the substrate contained within a cap is provided by the above-defined composition applied over the substrate and a portion of the height of the pins.

Moreover, the present invention is concerned with a process for hermetically sealing the backside of a substrate of an integrated circuit module which comprises:

A. providing a substrate having electrically-conductive pins protruding therefrom; and having attached to the backside thereof at least one integrated circuit chip;
B. placing said substrate into a cap wherein the backside of said substrate is covered by said cap;
C. providing the above-defined composition over the exposed surface of the substrate and a portion of the height of the pins; and
D. curing the composition to hermetically seal the backside of the substrate within the cap.

BRIEF DESCRIPTION OF DRAWING

The FIGURE is a schematic cross section of a module in accordance with the present invention.

DESCRIPTION OF BEST AND VARIOUS MODES

The compositions of the present invention contain about 50–65% by weight of an epoxy polymer. The epoxy polymer has an epoxy equivalent weight of at least about 400, preferably an epoxy equivalent weight of up to about 700, and most preferably an epoxy equivalent weight of about 600 to about 700. The epoxy polymers employed preferably are solid at room temperature and preferably have a melting point of about 75° to about 90° C., and most preferably have a melting point of about 75° to about 85° C.

Examples of suitable epoxy polymers employed according to the present invention include epoxidized novolak polymers, glycidyl ethers of a polynuclear dihydric phenol with a haloepoxy alkane, and reaction products thereof with polymers terminated with reactive groups. The preferred types of epoxy polymers employed according to the present invention are the polyepoxides of epichlorohydrin and bisphenol-A, i.e. 2,2-bis(p-hydroxyphenyl)propane. Other suitable epoxies as stated hereinabove include those obtained by reacting a polynuclear dihydric phenol with a haloepoxy alkane in general.

Suitable polynuclear dihydric phenols can have the formula:

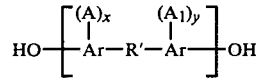

wherein Ar is an aromatic divalent hydrocarbon such as naphthalene and, preferably, phenylene, A and $A_1$ which can be the same or different are alkyl radicals, preferably having from 1 to 4 carbon atoms, halogen atoms, i.e., fluorine, chlorine, bromine and iodine, or alkoxy radicals, preferably having from 1 to 4 carbon atoms, x and y are integers having a value 0 to a maximum value corresponding to the number of hydrogen atoms on the aromatic radical (Ar) which can be replaced by substituents and R' is a bond between adjacent carbon atoms as in dihydroxydiphenyl or is a divalent radical including, for example,

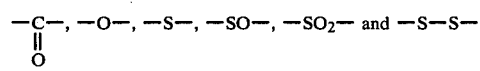

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals as well as alkarylene and aromatic radicals including halogenated, alkyl, alkoxy or aryloxy substituted aromatic radicals and a ring fused to an Ar group; or R' can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis-(hydroxyphenyl)alkanes such as 2,2-bis-(4-hydroxyphenol)propane, 2,4-dihydroxydiphenylmethane, bis-(2-hydroxyphenyl)methane, bis-(4-hydroxyphenyl)methane, bis-(4-hydroxy-2,6-dimethyl-3-methoxyphenyl)methane, 1,1-bis-(4-hydroxyphenyl)ethane, 1,2-bis-(4-hydroxyphenyl)ethane, 1,1-bis(4-hydroxy-2-chlorophenyl)ethane, 1,1-bis(3-methyl-4-hydroxyphenyl)-propane, 2,2-bis-(3-phenyl-4-hydroxyphenyl)propane, 2,2-bis(2-isopropyl-5-hydroxyphenyl)propane, 2,2-bis(4-hydroxynaphthyl)-propane, 2,2-bis-(4-hydroxyphenyl)pentane, 3,3-bis-(4-hydroxyphenyl)pentane, bis(4-hydroxyphenyl)-phenylmethane, bis-(4-hydroxyphenyl)-cyclohexylmethane, 1,2-bis-(4-hydroxyphenyl)-1,2-bis-(phenyl)propane and 2,2-bis-(4-hydroxyphenyl)-1-phenylpropane; di(hydroxyphenyl)sulfones such as bis(4-hydroxyphenyl)sulfone, 2,4'-dihydroxydiphenyl sulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,3'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)-ether, bis-(4-hydroxy-3-fluorophenyl)ether, bis-(4-hydroxy-3-bromophenyl)ether, bis-(4-hydroxynaphthyl)-ether, bis-(4-hydroxy-3-chloronaphthyl)ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

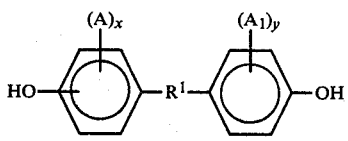

wherein A and A₁ are as previously defined, x and y have values from 0 to 4 inclusive and $R^1$ is a divalent saturated aliphatic hydrocarbon radical, particularly alkylene and alkylidene radicals having from 1 to 3 carbon atoms and cycloalkylene radicals having up to and including 10 carbon atoms. The most preferred dihydric phenol is bisphenol-A, i.e., 2,2-bis(p-hydroxyphenyl)propane.

The halo-epoxy alkane can be represented by the formula:

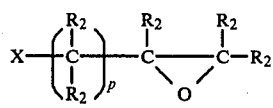

wherein X is a halogen atom (e.g., chlorine, bromine, and the like), p is an integer from 18, each $R_2$ individually is hydrogen or alkyl group of up to 7 carbon atoms; wherein the number of carbon atoms in any epoxy alkyl group generally totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxypropane, 1-bromo-3,3-epoxy-pentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane.

The epoxidized novolaks can be represented by the formula:

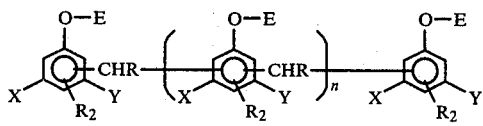

wherein n is at least about 1.2; E is hydrogen or an epoxyalkyl group, at least two E groups per polymer molecule being an epoxyalkyl group and wherein the epoxyalkyl group is represented by the formula:

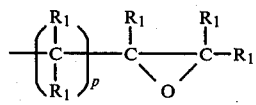

wherein p is an integer from 1–8; R is hydrogen or alkyl or alkylene or aryl or aralkyl or alkaryl or cycloalkyl or furyl group; each $R_1$ individually is hydrogen or alkyl group of up to 7 carbon atoms; wherein the number of carbon atoms in any epoxy-alkyl group totals more than 10 carbon atoms; each X and Y is individually hydrogen or chlorine or alkyl or hydroxyl; each $R_2$ individually is hydrogen or chlorine or a hydrocarbon group. Preferably, substantially all of the E groups are epoxyalkyl groups. Generally R, X, Y and $R_2$, when hydrocarbons, contain no more than about 12 carbon atoms.

The epoxy novolaks can be prepared by known methods by the reaction of a thermoplastic phenolic-aldehyde polymer of a phenol having the formula:

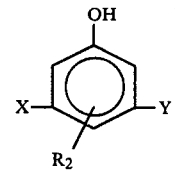

wherein X, Y and $R_2$ have the meaning as defined above with a halo-epoxy alkane of the formula:

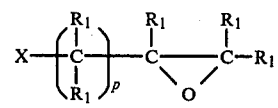

wherein X is a halogen atom (e.g., chlorine, bromine, and the like) and p and $R_1$ have the same meanings as defined hereinabove.

Hydrocarbon-substituted phenols having two available positions ortho or para to a phenolic hydroxy group for aldehyde condensation to provide polymers suitable for the preparation of epoxy novolaks include o- and p-cresols, o- and p-ethyl phenols, o- and p-isopropyl phenols, o- and p-ethyl phenols, o- and p-sec-butyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenyl, o- and p-phenethyl phenols, o- and p-phenyl phenols, o- and p-tolyl phenols, o- and p-xylyl phenols, o- and p-cyclohexyl phenols, o- and p-cyclopentyl phenols, 4-phenethyl resorcinol, 4-tolyl resorcinol, 4-cyclohexyl resorcinol.

Various chloro-substituted phenols which can also be used in the preparation of phenol-aldehyde resins suitable for the preparation of the epoxy novolaks include o- and p-chloro-phenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methyl-phenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,4-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, and 5-chloro-4-methyl-recorcinol.

Typical phenols which have more than two positions ortho or para to a phenolic hydroxy group available for aldehyde condensation and which, by controlled aldehyde condensation, can also be used are: phenol, m- cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-ethyl resorcinol.

As condensing agents any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, and hexamethylene tetramine. The aldehydes can also be used in the form of a solution, such as the commercially available formalin.

While glycidyl ethers, such as derived from epichlorohydrin, are preferred, the epoxy novolak polymers can contain epoxy-alkoxy groups of a greater number of carbon atoms. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxy-propane, 1-bromo-2,3-epoxy-pentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane.

Preferred epoxidized novolaks are represented by the formula:

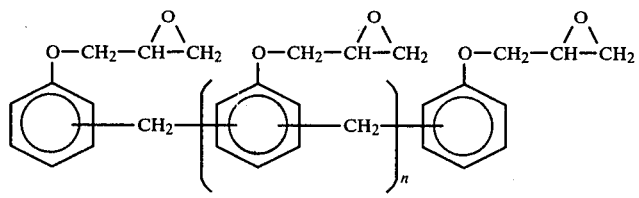

wherein n is at least about 0.2. The epoxidized novolak preferably is solid, and preferably n is about 1.5 to about 3.5.

Examples of reaction products of glycidyl ethers with polymers terminated with reactive groups include reaction products of glycidyl ether of bisphenol-A and epichlorohydrin with tetechelic prepolymers (i.e. prepolymers) having the reactive groups capable of producing strong elastomeric structures). The prepolymers are usually liquids. Examples of some polymer chains include polysulfide, polyisobutylene, polybutadiene, butadiene-acrylonitrile copolymer, polyamide, polyether and polyester. The reactive terminal groups include thiol, carboxyl, hydroxyl, amine and isocyanate. A preferred tetechelic prepolymer is carboxyl terminated butadiene-acrylonitrile prepolymer. Mixtures of epoxy polymers can be employed when desired.

Also, included in the compositions of the present invention is 4,4'-(2-acetoxy-1,3-glyceryl)-bis anhydrotrimellitate having the following structural formula:

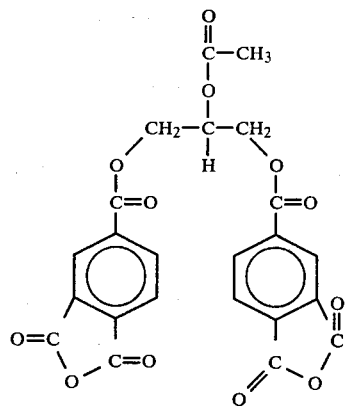

Such, as commercially available, has an average molecular weight of about 470 to about 480 and a melting point of about 60° to about 80° C. depending upon purity. The 4,4'-(2-acetoxy-1,3-glyceryl)-bis anhydrotrimellitate acts as a cross-linking agent in the composition. In addition, such is important for the necessary flow characteristics achieved by the present invention.

The presence of the trimellitate provides for resistance to reversion or hydrolysis of the cured product. The other polyanhydride present in the composition without the presence of the 4,4'-(2-acetoxy-1,3-glyceryl)-bis anhydrotrimellitate would result in reversion or hydrolysis of the cured polymer. However, the presence of the trimellitate surprisingly significantly reduces if not entirely prevents the hydrolysis of the entire composition under the normal conditions of use of the compositions of the present invention, even though another polyanhydride is present. Additional discussion of this unique aspect of the present invention can be found in IBM Technical Disclosure Bulletin, Vol. 22, No. 10, March 1980, p. 4467, entitled "Curing Agent Not Subject to Hydrolysis" by Gleason et al and prepared by and on behalf of the inventors of the present application, disclosure of which is incorporated herein by reference.

The trimellitate is employed in the composition in amounts of about 3 to about 15% by weight, and preferably about 5 to about 10% by weight.

The compositions of the present invention also include another polyanhydride in addition to the above defined trimellitate. The polyanhydride employed is solid at normal room temperature, and the preferred ones are represented by the formula:

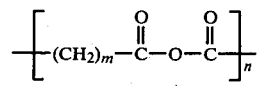

wherein m is a whole number integer from 4 to 8; and wherein n is an integer such that the polyanhydride is solid at room temperature, and preferably has a melting point of about 50° to about 85° C., and an average molecular weight of about 750 to about 1700. Examples of suitable polyanhydrides of the above formula include polyadipic polyanhydride, polyazelaic polyanhydride, and preferably polysebacic polyanhydride. A typical polyadipic polyanhydride has a melting point of about 65° to about 70° C., a minimum percent of anhydride of about 36%, an average molecular weight of about 750 to about 850, and a viscosity of about 200 centipoises at 100° C. A typical polyazelaic polyanhydride has a melting point of about 52° to about 65° C., a minimum percent of anhydride of about 35%, an average molecular weight of about 1200 to about 1300, and a viscosity of about 200 centipoises at 100° C. A typical polysebacic polyanhydride has a melting point of about 75° to about 80° C., a minimum percent anhydride of about 34%, a molecular weight of about 1600 to about 1700, and a viscosity of about 800 centipoises at 100° C. A further discussion of these polyanhydrides can be found in a publication available from Anhydrides and Chemicals, Inc., New York, N.Y. entitled "Polyanhydride Flexibilizing Hardeners for Epoxy Resins" by Michael S. Rhodes, a copy of which is attached hereto, and the disclosure of which is incorporated herein.

The polyanhydride is also a cross-linking agent for the composition and is employed in amounts of about 3 to about 15% by weight, and preferably about 5 to about 10% by weight. The combined amounts of the above trimellitate and the polyanhydride are generally such that it is present in amounts of at least about 50% of the theoretical stoichiometric amount up to the theoretical stoichiometric amount needed for reacting with the epoxy groups of polyepoxide. Preferably about 70 to about 75% of the theoretical amount is employed. The polyanhydride provides also for the necessary flexibility of the composition. In the absence of the trimellitate, reversion and hydrolysis of the cured product would occur. However, as mentioned above, the combination with the trimellitate results in a significant, if not entire reduction of the hydrolysis in the environment in which the present invention is to be employed. Furthermore, it has surprisingly been found that the combination of curing agents employed according to the present invention makes it possible to exclude the use of catalysts or accelerators such as amines which are normally used in epoxy compositions.

The compositions of the present invention also contain a solid filler in the amount of about 10 to about 45% by weight, and preferably about 20 to about 25% by weight. The solid filler employed has a particle size of about 5 to about 50 microns. Examples of some suitable fillers include silica, zinc oxide, and boron nitride. The boron nitride provides for improved thermal conductivity properties in the compressed powdered preform, as compared to the zinc oxide and silica. The preferred silica employed is an amorphous silica having a particle size of about 10 to about 20 microns. Furthermore, it is most preferred that the silica be surface treated with a silane in order to promote wetting of the polyepoxide to the filler. Normally a sufficient amount of silane is present on the filler to provide a monolayer of the silane.

Examples of suitable silanes have the following formula:

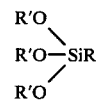

wherein R' is a hydrocarbon radical, and preferably an alkly radical of 1 to 6 carbon atoms, and R is an alkyl radical, an alkoxy-substituted alkyl radical in which the alkyl groups have from 1 to 6 carbon atoms.

Examples of some commercially available silanes are Dow Corning Z6040 and Union Carbide A-187 (gamma glycidoxy propyl-trimethoxy silane); Union Carbide A-1100 (gamma aminopropyl-triethoxy silane); Union Carbide A-1120 (N-beta (amino-ethyl)-gamma-aminopropyltrimethoxy silane); and Union Carbide A-1160 (Ureido-silane).

The above relative amounts of material are based upon the total of their individual amounts present in the composition and does not take into account the presence of auxiliary materials when present. In addition, the composition can contain other constituents, such as up to about 1% by weight of pigments or dyes, such as copper phthalocyanine blue. The main function of such is to provide color to the composition. In addition, copper phthalocyanine blue is especially good for the present invention, because it is thermally stable and because it is nonionic.

In addition, although the preferred compositions of the present invention are supplied in powder form or as compressed preforms, the compositions can also be applied in liquid form by adding an organic solvent, such as N-methyl-2-pyrrolidone and/or acetone. In the event that a solvent is employed, the compositions desirably have a viscosity of about 300 to about 6000 centipoise for control of the flow and curing characteristics of the composition so as to minimize "run-in" as much as possible.

It has also been found that the method of preparing the composition when in the powder form or compressed preforms is very important in achieving maximum properties. In particular, the compositions should be prepared by adding the epoxy polymer, filler, and pigment or dye if employed to a mixing vessel equipped with heating and stirring means, such as heated mixing blades. The composition should be heated to about 150° C.±10° C. The composition is degassed by applying a vacuum of about 28 inches mercury. In order to prevent the composition from being drawn into the vacuum lines, it is suggested that the vacuum be cut or broken several times during the degassing and mixing procedure. After the degassing and mixing procedure is complete, the composition can be cooled to about 70±5° C. At this point, pulverized trimellitate and polyanhydride having a particle size of less than about 1/16" are added to the composition. The constituents are then thoroughly and rapidly mixed, making certain that the temperature does not exceed about 75° C. The mixing should be completed in about 5 minutes maximum. After completion of the mixing, the composition should be rapidly removed from the mixer and cooled to room temperature as quickly as possible (e.g. in about 5 minutes or less) to prevent the anhydrides from activating. The composition should then be placed in sealed containers and refrigerated if such is to be stored instead of used shortly after preparation.

The compositions, if to be employed as compressed preforms, are subjected to about 15 to about 25 tons per square inch, and preferably about 20 tons per square inch pressure to provide preforms of about 50 to about 80 mils thick, and preferably about 70 to about 75 mils thick. The preforms are capable of being punched after compression, if desired. However, the preforms generally have holes already in the corresponding to where the pins in the module are located.

The figure illustrates a cross section of a module of the present invention. Numeral 1 illustrates the substrate through which pins 2 extend and protrude from the topside thereof. The substrate employed is preferably a ceramic substrate. A ceramic is a product or material manufactured by the action of heat on earthy raw materials. The preferred ceramic substrates include aluminum oxides, silicon oxides and silicates, such as aluminum silicates.

The pins of the module can be any of the input-output pins well known in the art and need not be discussed herein in any great detail. Examples of suitable pins are gold-plated pins, and tin-lead solder coated pins. The substrate can include preformed holes through which the input/output pins can be inserted so as to protrude from one surface of the substrate for insertion into circuit boards or cards. The pins also protrude slightly as represented by numeral 3 from the other surface referred to as the backside, so as to contact the circuitry on the backside which, in turn, connects to the integrated circuit chip mounted on the backside of the substrate. The integrated circuit chips, such as a silicon or polycrystalline chip is represented by numeral 4 and is attached to substrate 1 with solder 9. Numeral 5 represents the backseal composition and the approximate level of acceptable "run-in" is shown by 5A. Numeral 6 represents the cap or can.

The cap and/or can is preferably a metal, for example aluminum, that is employed to protect the backside, and especially the chip from mechanical damage. In addition, the metal cap facilitates cooling of the entire module in that heat is conducted thereby. The walls of the cap are closely toleranced with the dimensions of the substrate to provide a close fit. Once the chip is placed inside, the can can be crimped and the coating composition is applied which then adheres to the substrate hermetically to the sides of the can to thereby seal the backside from the surrounding environment. The upstanding walls 7 of the cap 6 are high enough so that the entire thickness of the substrate and the chip therebelow can fit inside the cap. As is well known, the cap includes stand-offs (not shown) upon which the chip carrier (substrate) can rest to prevent the chip from contacting physically with the bottom of the inside of the cap.

The area of pins to be covered by the sealing composition is generally referred to as the "stand-off" area of the pins. The composition is generally applied to the module up to the "stand-off" area in order to protect and seal the electrically active portions of the module.

After application of the composition, such is caused to flow and cure by the application of elevated temperature, and preferably temperatures of about 125° to about 150° C., and most preferably temperatures of about 130° to about 150° C. At these elevated temperatures, the viscosity of the composition is generally no greater than about 20,000 centipoise, and preferably at least about 300 centipoise. The most preferred viscosities are about 5000 to about 7000 centipoise. The compositions are generally cured within about 4 hours at such temperatures. In addition, the compositions gel in about 3 to about 6 minutes after application of the above elevated temperature and thereby cease to flow to any extended degree at that point. It is further noted that the compositions of the present invention do not require a post-cure, although such can be conducted to ensure full and sufficient cross-link density to obtain the desired solvent resistance and other properties. When employed, post-curing is generally carried out at temperatures of about 150° to about 200° C. for about 4 additional hours.

The following nonlimiting examples are presented to further illustrate the present invention.

EXAMPLE 1

About 54.3 parts by weight of Dow DER 662 epichlorohydrin-bisphenol-A epoxy polymer, about 6 parts by weight of Dow DER 661 diglycidyl epichlorohydrinbisphenol-A epoxy polymer, about 27 parts by weight of amorphous silica having a particle size of about 15 micron and coated with A-1100 silane, and about 0.7 parts by weight of copper phthalocyanine blue are added to a mixing vessel containing heated mixing blades which are heated to a temperature of about 150° C. The silica employed is available under the trade designation Imsil A-25E. The above are blended until melting occurs which is in about 15 minutes and a uniform mix is obtained. During the mixing, the composition is degassed by applying about 28 inches of mercury. The vacuum is removed about two times during the mixing to prevent the composition from being sucked up into the vacuum lines.

After this, the mixture is then cooled to about 70° C., and the mixing blades are continuously operated. Next, about 6 parts by weight of 4,4'-(2-acetoxy-1,3-glyceryl)-bis anhydrotrimellitate and about 6 parts by weight of polysebacic polyanhydride having an average molecular weight of about 1600 to about 1700 in pulverized form with particle sizes of less than about 1/16" are added to the above mixture. The temperature is maintained between about 70° and 75° C., and the materials are mixed in about 5 minutes. The composition is then removed from the mixing chamber and quickly cooled to room temperature in about 5 minutes by contact with a liquid nitrogen-air stream. Next, the composition is placed in sealed containers and refrigerated. The composition is then compressed into a preform of about 70 mils thick by applying pressure of about 20 tons per square inch. The preform is then applied to an integrated circuit module and heated to about 130° to about 140° C. for about 4 hours. At this point the composition is cured and the module is then tested for various physical characteristics. The compositions are subjected to temperatures of 125° C. in saturated steam for 1000 hours and show no reversion. The shore D hardness of the cured composition is about 89. The tensile strength measured at about 25° C. is 8600 psi, and at 100° C. is s 3000 psi. The longation at break at 4% at 25° C. and 15–20% at 100° C. The module is thermally aged at 150° C. for 3200 hours and exhibits no cracks. In addition, no bubble leakers are observed when the modules are subjected to 1221 cycles of alternating 0° and 100° C. temperatures. The volume resistivity is observed to be about $1.83 \times 10^{16}$ ohm/cm and the dielectric constant is about 4.07. The water permeation is significantly improved and the water solubility is much less than prior compositions. The volume resistivity is quite improved, since it demonstrates significant insulating properties which are much higher than those from usual epoxy compositions which normally range from about $10^{13}$ to about $10^{14}$.

EXAMPLE 2

The procedure of Example 1 is repeated, except that the composition contains about 52.5% by weight of a diglycidyl ether of epichlorohydrin bisphenol-A having an epoxy equivalent weight of about 450 to about 550; about 9 parts by weight of a polysebacic polyanhydride having a molecular weight of about 1600 to about 1700 and a melting point of about 72° to about 82° C., about 9 parts by weight of 4,4'-(2-acetoxy-1,3 glyceryl)-bis anhydrotrimellitate, about 23 parts by weight of the silica, and about 0.5 parts by weight of the copper phthalocyanine blue. The results obtained are similar to those of Example 1.

EXAMPLE 3

Example 1 is repeated, except that the filler employed is about 23 parts by weight of boron nitride in place of silica. The results obtained are similar to those of Example 1, except that the thermal conductivity is about $1 \times 10^{-2}$. This significant improved thermal conductivity is believed to be due to the plate-like nature of boron nitride and the use of the compression step in preparing the preform.

EXAMPLE 4

Example 1 is repeated, except that the filler employed is about 50 parts by weight of zinc oxide. The results obtained are similar to those of Example 1, except that the thermal conductivity is about $1.95 \times 10^{-3}$.

EXAMPLE 5

Example 1 is repeated, except that the filler employed is about 28 parts by weight of zinc oxide. The results obtained, including the thermal conductivity obtained, are similar to those of Example 1.

What is claimed is:
1. A composition containing:
    A. about 50-65% by weight of an epoxy polymer having an epoxy equivalent of at least about 400;
    B. about 2-15% by weight of 4,4'-(2-acetoxy-1,3-glyceryl) anhydrotrimellitate;
    C. about 2-15% by weight of a polyanhydride solid at room temperature having the formula:

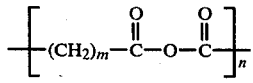

wherein m is a whole number integer of 4-8 and n is an integer such that said polyanhydride is solid at room temperature; and D. about 10-45% of a solid filler having a particle size of about 5-50 microns.
2. The composition of claim 1 wherein said epoxy polymer includes glycidyl ether of epichlorohydrin and bisphenol-A.
3. The composition of claim 1 wherein said epoxy polymer has an epoxy equivalent weight of up to about 700, and a melting point of about 75° to about 90° C.
4. The composition of claim 1 wherein said epoxy polymer has an epoxy equivalent weight of about 600 to about 700, and a melting point of about 75° to about 85° C.
5. The composition of claim 1 wherein the amount of said trimellitate is about 5 to about 10% by weight.
6. The composition of claim 1 wherein said polyanhydride is from the group of polyadipic polyanhydride; polyazelic polyanhydride; or polysebacic polyanhydride, and wherein the molecular weight is about 750 to about 1700.
7. The composition of claim 1 wherein said polyanhydride includes polysebacic polyanhydride having an average molecular weight of about 1600 to about 1700.
8. The composition of claim 1 wherein the amount of said polyanhydride is about 5 to 10% by weight.
9. The composition of claim 1 wherein said filler is silica.
10. The composition of claim 9 wherein said silica has a coating of silane thereon.
11. The composition of claim 1, 9 or 10 wherein the amount of said filler is about 20 to about 25%.
12. The composition of claim 1, 9 or 10 wherein the particle size of said filler is about 10-20 microns.
13. The composition of claim 10 wherein said silane is gamma glycidoxy propyltrimethoxy silane or gamma aminopropyltriethoxy silane.
14. The composition of claim 1 being in powdered form or compressed preform.
15. The composition of claim 1 which further contains up to about 1% by weight of a pigment.
16. The composition of claim 15 wherein said pigment is copper phthalocyanine blue.
17. A method for preparing the composition of claim 1 which comprises:
    A. admixing said epoxy and said solid filler at temperatures of about 140° to about 160° C. until a uniform melt is obtained;
    B. cooling the melt to about 65° to 75° C.;
    C. admixing said trimellitate and said polyanhydride into the melt while maintaining the temperature at about 65° to about 75° C.; and
    D. cooling the composition.
18. The composition of claim 1 wherein n is such that said polyanhydride has a melting point of about 50° to about 85° C. and an average molecular weight of about 750 to about 1700.

* * * * *